United States Patent [19]
Smith

[11] Patent Number: 5,699,013
[45] Date of Patent: Dec. 16, 1997

[54] TRI-STATE AUDIO DIFFERENTIAL DRIVER

[75] Inventor: Harold Arthur Smith, Indianapolis, Ind.

[73] Assignee: Thomson Consumer Electronics, Inc., Indianapolis, Ind.

[21] Appl. No.: 570,156

[22] Filed: Dec. 11, 1995

[51] Int. Cl.$^6$ ............................. H03F 3/68; H03F 3/183
[52] U.S. Cl. ..................... 330/51; 330/148; 330/258; 330/301
[58] Field of Search ..................... 330/51, 124 R, 330/146, 148, 258, 275, 295, 301; 326/56–58; 348/707

[56] References Cited

U.S. PATENT DOCUMENTS

| | | | |
|---|---|---|---|
| 4,581,645 | 4/1986 | Beyers, Jr. | 358/181 |
| 4,647,973 | 3/1987 | Deiss | 358/181 |
| 5,014,017 | 5/1991 | Ishiguro et al. | 330/51 |
| 5,448,311 | 9/1995 | White et al. | 348/707 |

FOREIGN PATENT DOCUMENTS

| | | | |
|---|---|---|---|
| 43707 | 1/1982 | European Pat. Off. | 330/51 |

OTHER PUBLICATIONS

Graeme, Jerald G. Applications Of Operational Amplifiers Third Generation Techniques, McGraw–Hill, Pub. 1973, pp. 50–53.

"Schematic diagram of stereo, selected audio and Hi–Fi outputs", Television Chassis No. CTC–179, mfg. by Thomson Consumer Electronics, Inc., Nov. 1995.

*Primary Examiner*—James B. Mullins
*Attorney, Agent, or Firm*—Joseph S. Tripoli; Peter M. Emanuel; Frank Y. Liao

[57] ABSTRACT

First and second amplifiers are coupled together to provide complementary output signals at respective output terminals in response to application of operating potentials to first and second supply terminals of each amplifier and application of an input signal to at least the first amplifier. A switching circuit, responsive to a first level of a tri-state control signal supplied thereto, applies the operating potentials individually to the first and second supply terminals of each amplifier and concurrently couples the input signal to the input of the first amplifier and, responsive to a second level of the tri-state control signal, isolates all of the amplifier supply terminals and decouples the input signal. Transient disturbances are minimized by AC coupling the input signal and applying a common mode signal from a common mode source to the AC coupling, to a reference input of each amplifier and to the output terminal of each amplifier.

11 Claims, 3 Drawing Sheets

TRI-STATE AUDIO DIFFERENTIAL DRIVER

FIELD OF THE INVENTION

This invention relates to audio interconnection systems generally and particularly to baseband audio driver amplifiers for providing tri-state drive signals to an audio bus.

BACKGROUND OF THE INVENTION

Bus oriented bi-directional audio interconnection systems are known and used, for example, for interconnecting components in "audio/video" (A/V) systems. A typical A/V system may include audio only sources, such as amplifiers and compact disc players, or it may include a number of audio and video sources such as video tape recorders, video disc players, television tuners, video cameras, and so forth. Such applications require the ability of the driver to apply video signals to the bus with a relatively low source or sink impedance and to isolate video signals from the bus with a relatively high "off state" impedance. Such a characteristic is called a "tri-state" operation because three drive conditions comprising (1) supplying or "sourcing" current to the bus with a low impedance, (2) removing or "sinking" current from the bus with a low impedance and (3) isolating or de-coupling the video signal from the bus with a very high impedance, essentially an open circuit. By use of "tri-state" operation, transmission via the bus between one component and another may be bi-directional.

One may achieve such tri-state operation by coupling the output of an audio driver to an audio bus by means of a mechanical relay. Mechanical relays have excellent electrical characteristics for this purpose in terms of on and off impedances but are relatively expensive and may be relatively bulky, unreliable and slow. Solid state switches, such as transmission gates, may also be used for selectively coupling audio signals to a bus but typically exhibit a relatively high "on" resistance and the "on" resistance may also vary with signal levels thus introducing undesirable signal distortions.

An example of the use of a "solid state" or transistor switch for selectively coupling a "single-ended" (i.e., un-balanced or non-differential) audio signal to a bi-directional audio bus is described by Beyers, Jr. in U.S. Pat. No. 4,581,645 entitled DISTRIBUTED SWITCHED COMPONENT AUDIO/VIDEO SYSTEM which issued Apr. 8, 1986. In an exemplary audio tri-state driver amplifier therein described, left and right audio signals are selectively coupled to respective bi-directional non-differential audio buses by means of respective series coupled field effect transistors. The gates of the field effect transistors are connected to a tri-state driver amplifier that switches the gate voltage between a supply voltage source (+5v) and ground thereby selectively coupling left and right (stereo) audio sources to respective ones of a pair of single conductor buses. To minimize transients when turning the series coupled field effect transistor switch on and off, the circuit includes a resistor for applying the tri-state control voltage to the transistor gate and a gate to source capacitor. These components reduce low frequency transient disturbances during switching by reducing the switching time of the field effect transistor.

It is known, generally, that amplifiers may be used as series switches for coupling and decoupling audio signals with the switch being controlled by switching the supply voltage to the amplifier. Audio muting amplifiers using both series switching and shunt clamping are used, for example, in a television receiver Chassis Number CTC-179 manufactured by Thomson Consumer Electronics, Inc. In the CTC-179, the audio output of a television receiver at an output jack is muted by concurrently (1) removing positive and negative supply voltages from an output driver amplifier and (2) enabling a "T" type resistive attenuator which is coupled between the driver amplifier output and the audio output jack. The "T" attenuator provides increased audio muting over that obtainable by just interrupting the driver amplifier power and is formed by coupling the amplifier output to the output jack by a pair of series coupled resistors. For muting, the amplifier power is disabled and a clamp transistor, coupled between the common connection of the pair of resistors and ground is enabled thereby grounding the output jack via the output resistor when in the muting mode. This approach, however, is not suitable for use in bi-directional bus applications or in balanced line or "twisted pair" operation in cases where the series resistance of the attenuator exceeds the desired driving impedance of the line.

Another aspect of The CTC-179 muting system is that the system employs dual integrated circuit amplifiers (type TL082) for driving and muting left and right audio signals. While this works well in muting application, it presents problem if the amplifiers were to be used as a differential line driver where a high level of DC isolation is needed in a tri-state mode. One aspect of this problem is that under tri-state conditions signals on an "active" bus may exceed the breakdown voltages of parasitic diodes in the integrated circuit and so place a relatively low impedance on the bus. Yet another problem with using the muting system as a differential bus driver is that the system employs dual power supplies with the amplifier outputs being grounded by a clamp to ground during tri-state operation and DC coupled to ground otherwise thus preventing control or adjustment of the common mode voltage over a range of values.

A tri-state circuit which is effective for bi-directional differential or balanced line applications is described by White et al. in U.S. Pat. No. 5,448,311 entitled TRI-STATE VIDEO DIFFERENTIAL DRIVER which issued 5 Sep. 1995.

In the White et al. tri-state differential line driver, isolation of the driver from a balanced bus is achieved by biasing four output transistors off during tri-state operation. More specifically, in an exemplary embodiment of the White et al. apparatus, a differential current source derives first and second complementary currents from a video input signal which are coupled via respective load networks to a common supply terminal and develop first and second complementary video output signals. A first output circuit applies the first output signal to a first output terminal via a voltage follower transistor and applies the second output signal to the first output terminal via a current source transistor. A second output terminal is similarly driven by a second voltage follower transistor and a second current source transistor, all transistors being of the same conductivity type. A tri-state control circuit, coupled to the differential current source, enables the differential current source in a first operating mode to produce the first and second complementary currents whereby push pull output signals are produced at the output terminals. In a second operating mode, the tri-state control circuit forces the complementary currents to zero whereby the common supply terminal applies turn-off bias via the two load networks to the control electrodes of all of the output transistors thereby "tri-stating" (isolating) the output terminals.

Advantageously, in the tri-state mode of the White et al. apparatus, there is zero quiescent power dissipation in the output circuits, in the load networks, in the differential current source and in the tri-state control circuit. Also, since there is no feedback involved, the driver is unconditionally stable which is of particular importance at video frequencies. In short, the overall performance of the White et al. tri-state differential driver is excellent for video signals. However, for audio signals some-what different considerations become significant, especially dynamic range, since audio signals are typically much larger than video signals and require a significantly wider dynamic range.

SUMMARY OF THE INVENTION

Tri-state differential line driver apparatus, In accordance with the invention, comprises first and second amplifiers coupled together to provide complementary output signals at respective output terminals in response to application of operating potentials to first and second supply terminals of each amplifier and application of an input signal to at least the first amplifier. A switching circuit, responsive to a first level of a tri-state control signal supplied thereto, applies the operating potentials individually to the first and second supply terminals of each amplifier and concurrently couples the input signal to the input of the first amplifier and, responsive to a second level of the tri-state control signal, isolates all of the amplifier supply terminals and decouples the input signal.

BRIEF DESCRIPTION OF THE DRAWING

The foregoing and further features of the invention are illustrated in the accompanying drawing, wherein like elements are denoted by like reference characters, and in which.

DETAILED DESCRIPTION

Figure 1:
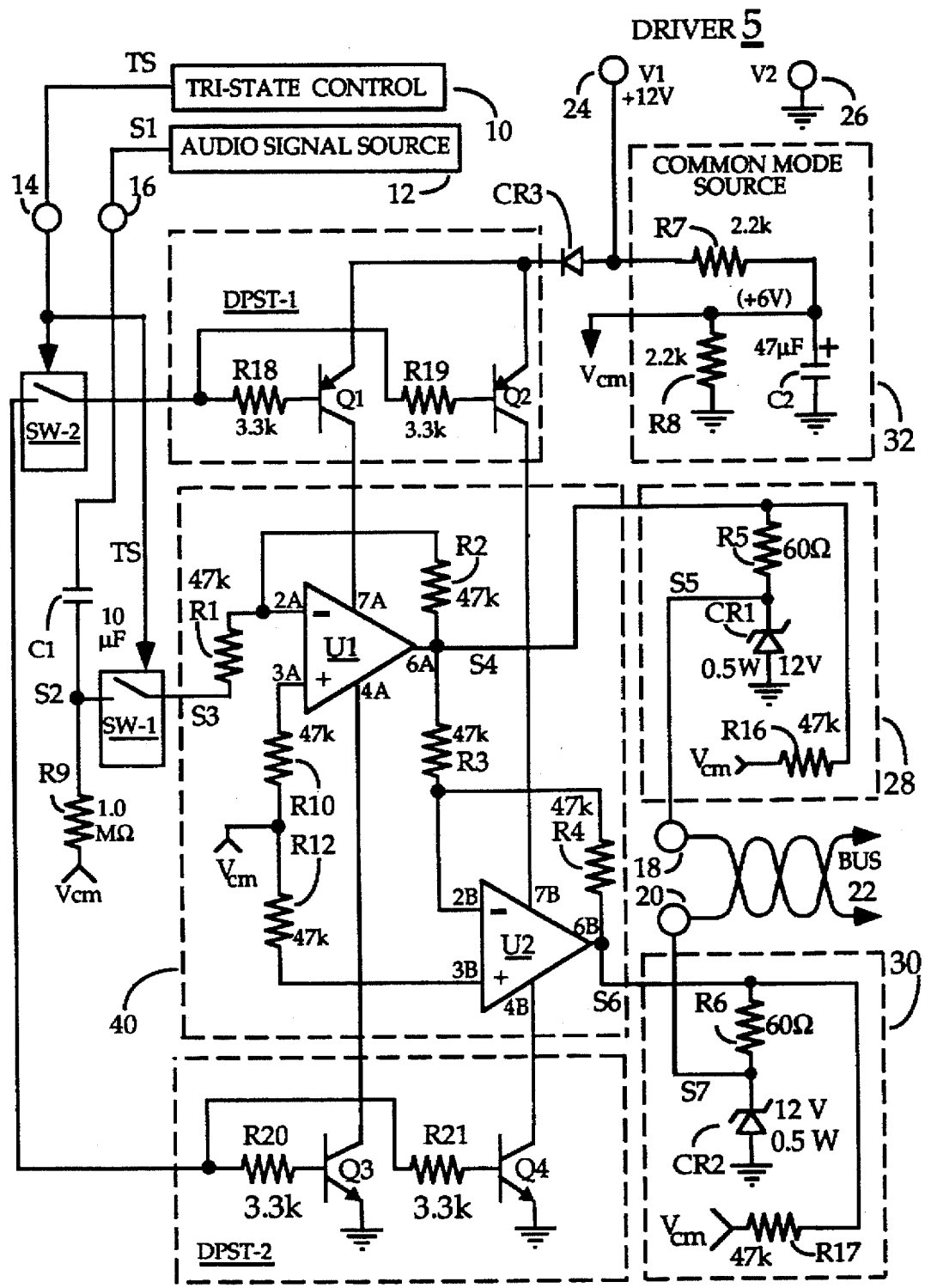
FIG. 1 is a schematic diagram, partially in block form, of tri-state audio driver apparatus embodying the invention.

The tri-state differential driver apparatus 5 in FIG. 1 is intended to be used, illustratively, in a bus-oriented, component, audio/video system for facilitating interconnection of system components via a common bus. The driver, of course, may be used in other applications in which a balanced differential output and tri-state operation (for bi-directional bus operation and bus sharing) may be desired. The specific embodiment shown is designed for single-supply operation with a +12 volt supply and provides balanced output signals with a common mode voltage of +6 volts. When in an active or driving state, the output terminals are driven by low impedance sources through 60 Ohm resistors thus providing a differential source impedance of 120 Ohms line-to-line and a common mode source impedance of 60 Ohms relative to ground. During tri-state operation, the output terminals are "floating" or electrically isolated from the supply terminals thus permitting "sharing" of the bus with other driver circuits and bi-directional operation. In both the active or the tri-state modes, a common mode voltage is coupled to several circuit points for minimizing certain transient effects during mode switching. In the interest of completeness, exemplary element values are shown in the drawing.

Driver apparatus 5 includes a pair of input terminals 14 and 16 for connection to a source 10 of a tri-state control signal TS and a source 12 of an audio signal. In a television receiver, for example, the receiver microprocessor controller may be used to generate the tri-state control signal TS for controlling components connected to the system bus. The audio source, in a television receiver may be provided by the receiver's tuner. As previously mentioned, such bus-oriented audio/video systems are well known.

The audio signal S1 provided by source 12 is AC coupled via a capacitor C1 to a switch SW-1 connected to the input of a single-ended to differential signal converter 40 (outlined in phantom). The AC coupling ensures that the common mode output signal component is independent of any DC component of the audio input signal. When switch SW1 is closed during the driving mode of operation, at least one source of common mode voltage will be coupled via switch SW1 to charge capacitor C1 to the common mode voltage. This prevents transients (audio "thumps") when switch SW1 is opened and closed. However, the switch SW1 can not supply common mode charging current to capacitor C1 during the tri-state mode because switch SW1 is open in that mode. To prevent capacitor C1 from discharging (e.g., via internal leakage) a second source of common mode signal is provided for the capacitor. The capacitor is coupled via a relatively high valued resistor R9 (1.0 MegOhm) to a source 32 of common mode voltage Vcm. Advantageously, this feature of the invention ensures proper clamping of the input AC decoupling capacitor to the desired common mode output voltage regardless of the state of the tri-state signal.

The common mode voltage source 32 (outlined in phantom) includes a potential divider comprising resistors R7 and R8 coupled between a positive supply terminal 24 and ground. A positive voltage V1 of 12 volts is applied to terminal 24 and a ground reference voltage is applied to ground terminal 26. Since resistors R7 and R8 are of equal values, the common mode voltage produced is +6 volts and this voltage is smoothed by a capacitor C2 coupled between the output of source 32 and ground.

When the switch SW1 is closed to enable the bus driving mode of operation, the input signal S2, stripped of its original DC component and provided with a new DC common mode component Vcm, is applied via switch SW1 and resistor R1 to amplifier U1. In this example of the invention, the amplifier U1 (e.g., an operational amplifier such as a type 741) is connected in a unity gain inverting mode. Unity gain is achieved by coupling the amplifier output terminal 6A to the inverting input terminal 2A via a feedback resistor R2 of equal value to the input resistor R1. To establish the quiescent output voltage of amplifier U1 the non-inverting input 3A is coupled to the source 32 of common mode voltage Vcm via a resistor R10. Accordingly, the quiescent output voltage of amplifier U1 at its output terminal 6A is equal to the common mode voltage Vcm. The primary purpose of resistor R10 (and R11) is to maintain a relatively high impedance (47 kOhms) for the common mode voltage source 32 in the tri-state mode. Note that as switch SW1 is opened and closed when changing modes, the common mode voltage on both sides of switch SW1 are equal and so operation of switch SW1 does not change the average capacitor charge and thus prevents an annoying "thump" when changing modes. It will be also noted that when power supply V1 is turned off, a diode CR-3 prevents loading of bus 22 by reverse conduction through transistors Q1 and Q2.

To obtain balanced complementary output signal voltages in converter 40, in this embodiment of the invention, a second amplifier U2 is provided which is also connected in an inverting configuration. Specifically, the inverting input 2B of amplifier U2 is coupled via input resistor R3 to the output of amplifier U1 and is coupled via a feedback resistor R4 to the U2 amplifier output 6B. The resistors R3 and R4 are equal valued and so the signal S4 at the output of amplifier U1 is inverted and appears signal S6 at the output of amplifier U2.

To provide the desired common and differential mode output impedances, and to also protect the tri-state driver from transients on the bi-directional differential (twisted pair) bus 22, and to provide an even high level of stabilization of the quiescent common mode output voltage, the amplifiers U1 and U2 are coupled to the bus via respective coupling networks 28 and 30.

Network 28 includes a series resistor R5 of 60 Ohms coupled between the output of amplifier U1 and the bus terminal 18. Network 30 includes a similar resistor R6 of 60 Ohms for coupling the output of amplifier U2 to the bus terminal 20. Accordingly, these elements of the networks 28 and 30 ensure that the desired common mode output impedance of 60 Ohms relative to ground and the desired differential mode output impedance of 120 Ohms are applied to the bus terminals when the amplifiers are provided with operating power. During tri-state operation, as discussed later, the output terminals 18 and 20 assume a relative high impedance condition or "float" relative to the driver 5.

For reverse transient voltage protection from the bus 22, the networks 28 and 30 both include voltage break-down devices CR1 and CR2, respectively, that are coupled between the bus terminals 18 and 20 and ground and have break-down voltages equal to the supply voltage V1 (e.g., 12 volts). In operation, when amplifiers are driving the bus 22 their supply terminals are coupled to the supply source for voltage V1 which is of low impedance. The amplifiers, being integrated circuit amplifiers, are subject to damage by junction break-down if voltage spikes applied to their output terminals exceed their supply voltages. Accordingly, break-down devices or Zener diodes CR1 and CR2 prevent any voltage spikes from bus 22 ever reaching the outputs of amplifiers U1 and U2.

A further feature of networks 28 and 30 relates to providing a further source of common mode voltage for the case in which amplifiers U1 and U2 are tri-stated or isolated from the positive and ground voltage supplies. When the power to amplifier supply terminals 7A, 7B 4A and 4B is interrupted to achieve tristate operation, amplifiers U1 and U2 are essentially "floating" or electrically isolated from ground and the positive supply. Moreover, they are inoperative. In this connection, recall that when amplifiers U1 and U2 are actively driving the bus, that the common mode voltage applied to the non-inverting inputs 3A and 3B establishes the common mode output voltages because of feedback. This can not happen during the tri-state mode, however, because there is no feedback and so, without correction, the output voltages of amplifiers U1 and U2 would be undefined in the tri-state mode. To avoid this, when the amplifiers are disabled to provide tri-state operation, the common mode voltage Vcm is applied to the output terminals of the amplifiers via resistors R16 and R17 whereby the amplifier output terminals assume a voltage substantially equal to Vcm.

Tri-state control is provided by a switching circuit including a single-pole single-throw switch SW2 and a pair of "double-pole single-throw" switches DPST-1 and DPST-2 in conjunction with switch SW1 previously discussed. Specifically, operating voltage for amplifiers U1 and U2 is provided by PNP transistors Q1 and Q2 connected at the emitters thereof to the 12 volt positive supply terminal 24 and at the collectors thereof to respective supply terminals 7A and 7B of amplifiers U1 and U2. NPN transistors Q3 and Q4 are connected at the emitters thereof to ground and at the collectors thereof to the Vee supply terminals 4A and 4B of amplifiers U1 and U2.

When transistors Q1-Q4 are biased on, amplifiers U1 and U2 operate as previously described to drive the bus 22 with complementary audio signals. When biased off, the amplifier output terminals 6A and 6B are electrically isolated or "floating" relative to ground and the supply terminal in this tri-state mode. To turn all of the transistor switches on simultaneously for driving the bus 22, the bases of transistors Q1 and Q2 are coupled via respective base resistors R18 and R19 to one terminal of switch SW2 (e.g., a FET or transmission gate) the other of which is coupled via base current limiting resistors R20 and R21 to the bases of transistors Q3 and Q4. Accordingly, when the tri-state control signal TS is applied to close switch SW2 all transistors receive base current and are biased to drive bus 22. Conversely, when the tri-state control signal TS is applied to open switch SW2, all power will be removed from transistors Q1-Q4 and the output terminals will be electrically isolated from the supply and ground potentials.

In brief summary, the power switching transistors Q1-Q4, in response to a first level of the tristate control signal TS sufficient to turn switches SW1 and SW2 on, apply operating potentials (+12V, ground) to first (7A, 7B) and second (4A, 4B) supply terminals of each amplifier and concurrently coupled the input signal via switch SW1 to at least one (U1 in this case) of the amplifiers (U1 and U2). In response to a second level of the tri-state control signal TS, the switches Q1-Q4 isolate the amplifier supply terminals and switch SW1 decouples the input signal.

Figure 2:
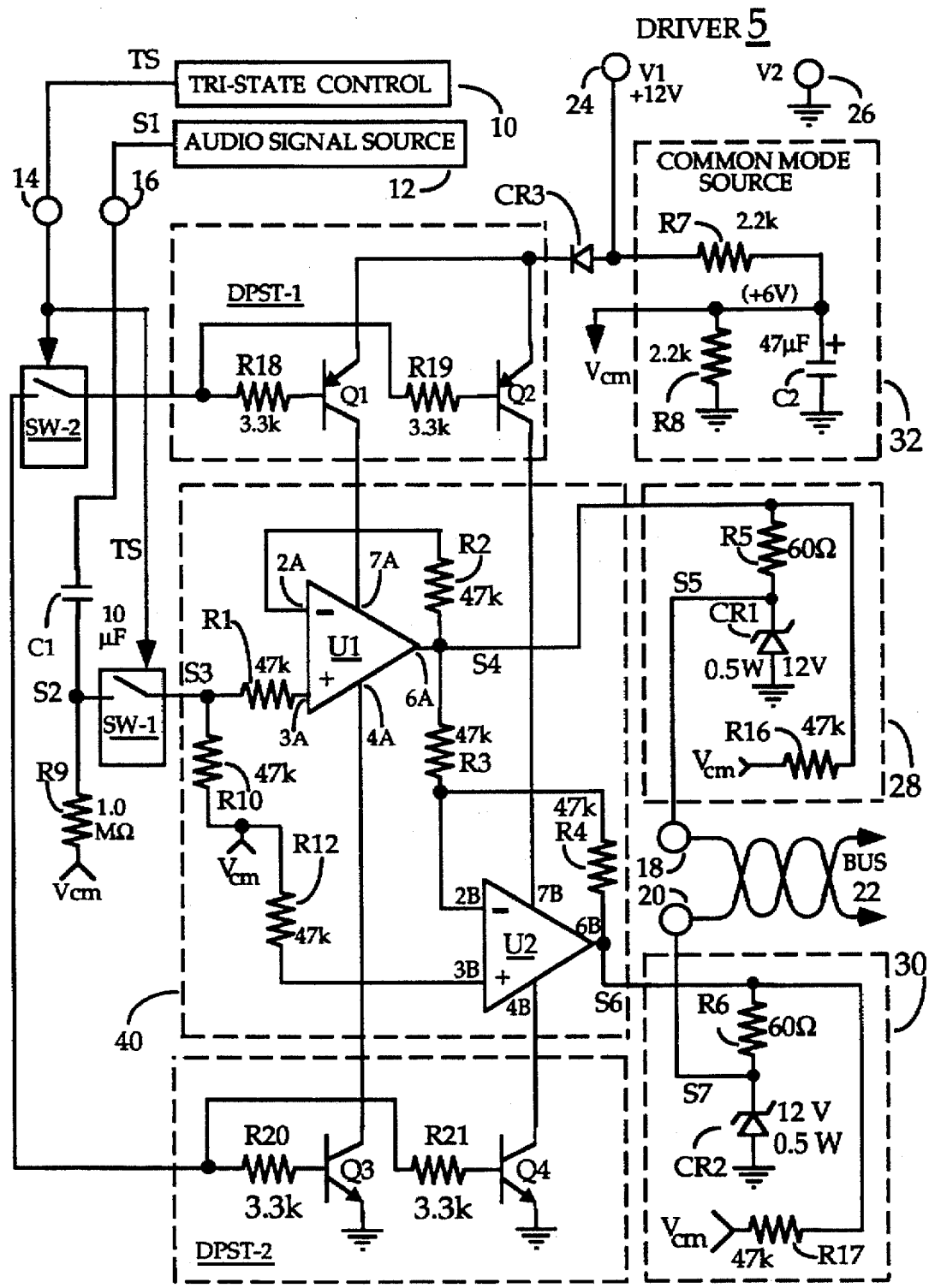
FIGS. 2 and 3 illustrate modifications of the tri-state audio driver apparatus of FIG. 1.
Figure 3:
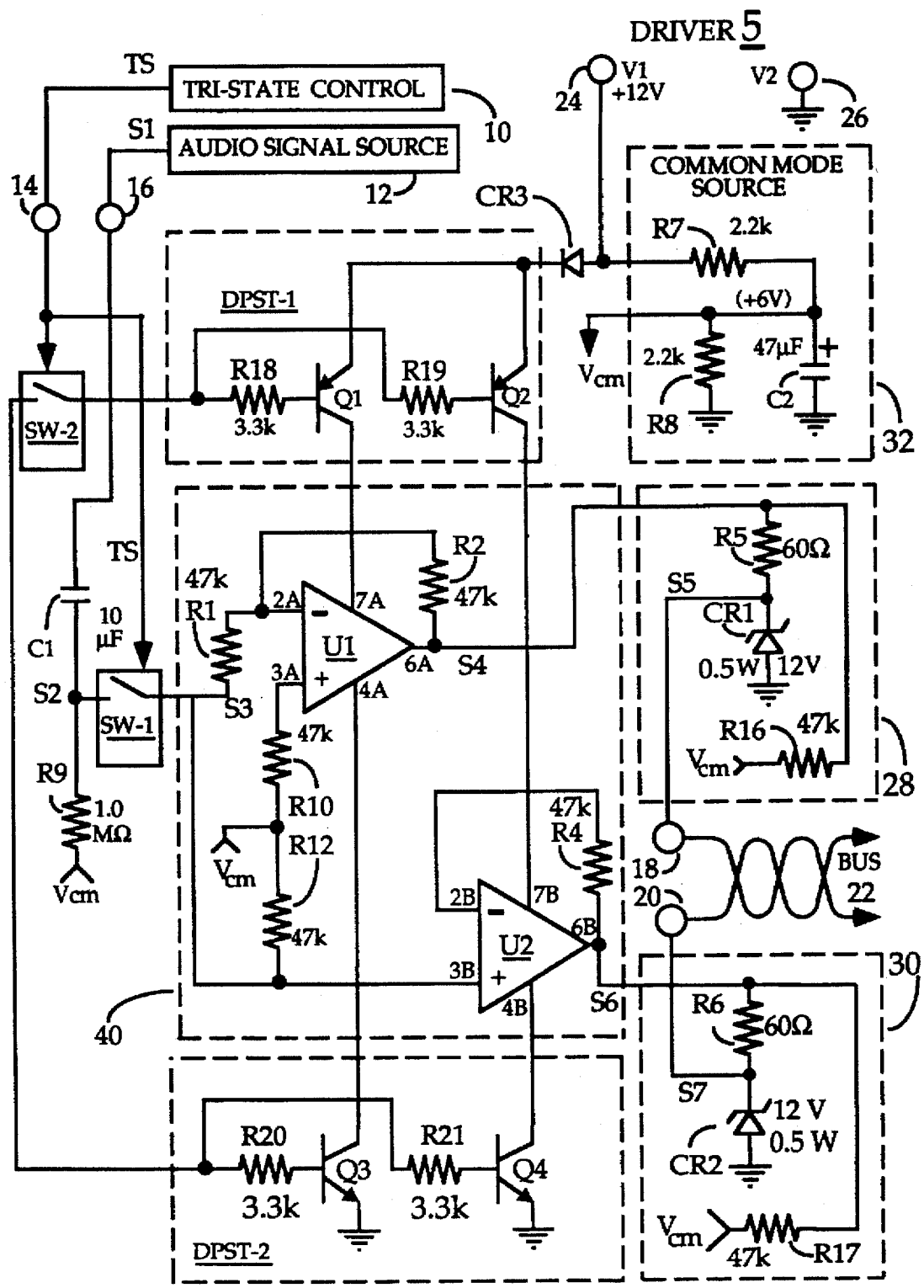

Various modifications may be made to the example of the invention discussed above. For example, bipolar switches may be replaced by field effect transistor switches with suitable adjustment for differing bias requirements. In FIG. 1 amplifiers U1 and U2 are both configured (connected) as inverting amplifiers. FIG. 2 illustrates a modification in which amplifier U1 is operated in a non-inverting mode and amplifier U2 is operated in an inverting mode. This is achieved by moving resistor R1 to coupled terminal 3A to switch SW1 and by moving resistor R10 to coupled the common mode voltage Vcm to the output of switch SW1. This change results in a reversal of the phase of the complementary signals supplied to bus terminals 18 and 20. FIG. 3 illustrates a modification of the example of FIG. 1 wherein amplifier U1 is operated as an inverting amplifier and amplifier U2 is operated as a non-inverting amplifier. This is realized by removing resistor R3 from the circuit of FIG. 1 and by coupling the non-inverting input terminal 3B of amplifier U2 to the output of switch SW1. This configuration provides the same output signal phasing as in the example of FIG. 1. Of the examples of FIGS. 1, 2 and 3 shown, the example of FIG. 1 has an advantage in that being of identical configuration (inverting) the amplifiers U1 and U2 may be expected to exhibit similar slew rates and bandwidths where this is not always the case when using mixed inverting and non-inverting amplifier configurations.

What is claimed is:

1. Tri-state differential line driver apparatus, comprising:
   first and second amplifiers coupled together to provide complementary output signals at respective output terminals in response to application of operating potentials to first (7A, 7B) and second supply terminals of each amplifier and application of an input signal to at least one of the amplifiers; and
   a switching circuit, responsive to a first level of a tri-state control signal supplied thereto, for applying operating potentials to the first and second supply terminals of each amplifier and for concurrently coupling said input signal to said input of said at least one of said amplifiers and, responsive to a second level of said tri-state control signal, for isolating said supply terminals and for decoupling said input signal.

2. Apparatus as in claim 1 further comprising:

means for applying a common mode voltage to each amplifier output terminal and to a non-inverting input of each amplifier.

3. Apparatus as in claim 1 further comprising:

means for continuously applying a common mode voltage to each amplifier output terminal and to a non-inverting input of each amplifier independently of the level of said tri-state control signal.

4. Apparatus as in claim 1 further comprising:

AC coupling means for removing DC components of said input signal; and a common mode signal source for applying a common mode signal to said AC coupling means, to a reference input of each amplifier and to the output terminal of each amplifier.

5. Apparatus as in claim 1, further comprising:

a pair of bus connection terminals each being coupled via a respective threshold conduction device to one of said operating potentials and being coupled via a respective resistor to a respective output of each amplifier.

6. Tri-state differential line driver apparatus, comprising:

first and second amplifiers, each having first and second supply terminals, an input terminal and an output terminal, said amplifiers being coupled together to provide complementary output signals at said output terminals in response to application of operating potentials to said supply terminals and application of an input signal to the input of at least one of said amplifiers;

a switching circuit, responsive to a first level of a tri-state control signal supplied thereto, for applying operating potentials to said supply terminals and for concurrently coupling said input signal to said input of said at least one of said amplifiers and, responsive to a second level of said tri-state control signal for isolating said supply terminals and de-coupling said input signal so as to place the output terminals of said amplifiers in a high impedance state.

7. Apparatus as in claim 6 further comprising:

means for applying a common mode voltage to each amplifier output terminal and to a non-inverting input of each amplifier.

8. Apparatus as in claim 6 further comprising:

means for continuously applying a common mode voltage to each amplifier output terminal and to a non-inverting input of each amplifier independently of the level of said tri-state control signal.

9. Tri-state differential line driver apparatus, comprising:

first and second amplifiers, each having first and second supply terminals, an input terminal and an output terminal, said amplifiers being coupled together to provide complementary output signals at said output terminals in response to application of operating potentials to said supply terminals and application of an input signal to the input of at least one of said amplifiers;

a first switch, responsive when closed, for coupling a first source of operating voltage to the first supply terminal of each amplifier and responsive when opened for electrically isolating the first supply terminal of each amplifier;

a second switch, responsive when closed, for coupling a second source of operating voltage to the second supply terminal of each amplifier and responsive when opened for electrically isolating the second supply terminal of each amplifier;

a third switch, responsive when closed, for coupling said input signal directly to said least one of said amplifiers and responsive when opened for electrically isolating said input signal from said at least one amplifier; and tri-state control means having a first mode for concurrently closing each switch and a second mode for concurrently opening each switch.

10. Tri-state differential line driver apparatus, comprising:

first and second amplifiers, each having first and second supply terminals, an input terminal and an output terminal, said amplifiers being coupled together to provide complementary output signals at said output terminals in response to application of operating potentials to said supply terminals and application of an input signal to the input of at least one of said amplifiers;

first and second switches, responsive when closed, for coupling respective ones of said first supply terminals to a first potential source;

third and fourth switches, responsive when closed, for coupling respective ones of said second supply terminals to a second potential source;

a fifth switch, responsive when closed, for applying said input signal to said input of said at least one of said amplifiers;

a tri-state control circuit having a first mode for closing said switches and having a second mode for opening said switches; and a common mode signal source coupled to apply a common mode signal to an input of said fifth switch, to an input of each amplifier and to the output of each amplifier.

11. Apparatus as recited in claim 10 further comprising:

a pair of bus connection terminals (18, 20) each being coupled via a respective threshold conduction devices (CR1, CR2) to one of said potential sources (26) and being coupled via a respective resistor (R5, R6) to respective outputs (6A, 6B) of each amplifier (U1, U2).

* * * * *